United States Patent [19]
Weber

[11] Patent Number: 5,379,318
[45] Date of Patent: Jan. 3, 1995

[54] ALTERNATING GRATING TUNABLE DBR LASER

[75] Inventor: Jean-Pierre Weber, Stockholm, Sweden

[73] Assignee: Telefonaktiebolaget L M Ericsson, Stockholm, Sweden

[21] Appl. No.: 188,770

[22] Filed: Jan. 31, 1994

[51] Int. Cl.$^6$ ............................................. H01S 3/08
[52] U.S. Cl. ......................................... 372/96; 372/20; 372/50
[58] Field of Search ........................... 372/96, 50, 20

[56] References Cited

U.S. PATENT DOCUMENTS

| | | | |
|---|---|---|---|
| 4,829,535 | 5/1989 | Utaka | 372/50 |
| 4,873,696 | 10/1989 | Coldren et al. | 372/96 |
| 4,971,415 | 11/1990 | Hara et al. | 350/96.11 |
| 4,995,048 | 2/1991 | Kuindersma et al. | 372/50 |
| 5,007,062 | 4/1991 | Chesnoy | 372/26 |
| 5,088,097 | 2/1992 | Ono et al. | 372/20 |
| 5,164,956 | 11/1992 | Lang | 372/96 |

OTHER PUBLICATIONS

"Semiconductor Lasers for Coherent Optical Fiber Communications", Thomas L. Koch et al., *Journal of Lightwave Technology*, vol. 8, No. 3, pp. 274–293, Mar. 1990, IEEE.

Primary Examiner—Georgia Y. Epps
Attorney, Agent, or Firm—Burns, Doane, Swecker & Mathis

[57] ABSTRACT

A modified DBR laser having at least one extended tuning range is disclosed. A plurality of gratings are arranged on opposing sides of a gain section which can be selectively tuned to provide one or more continuous wavelength ranges of laser light.

8 Claims, 2 Drawing Sheets

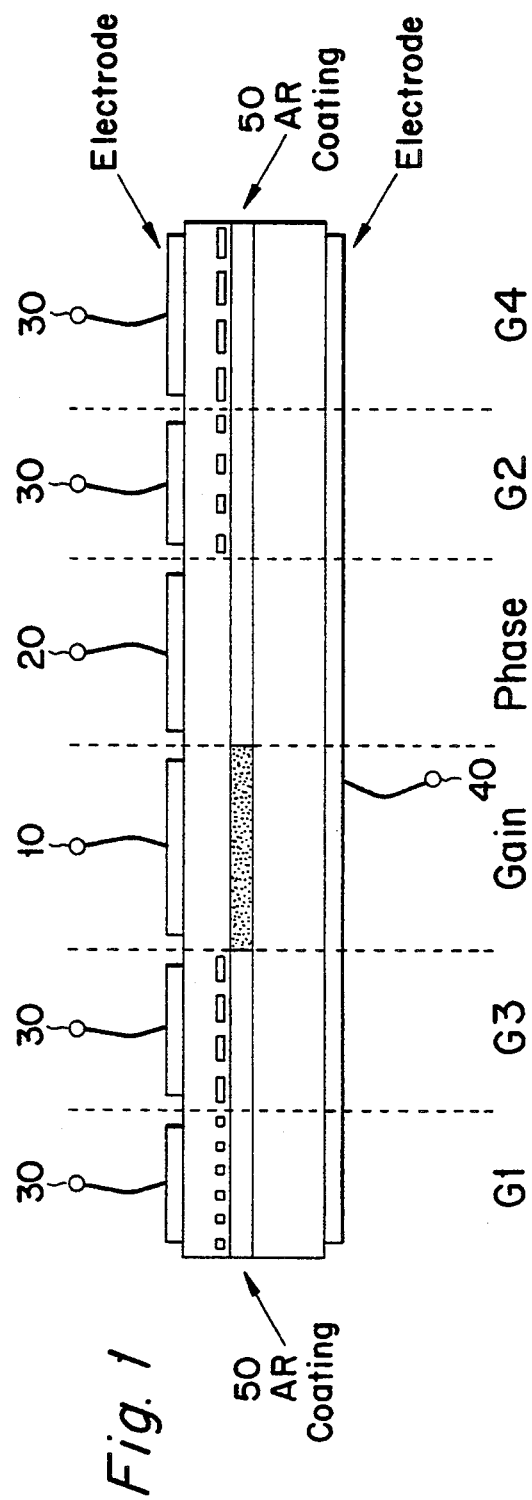
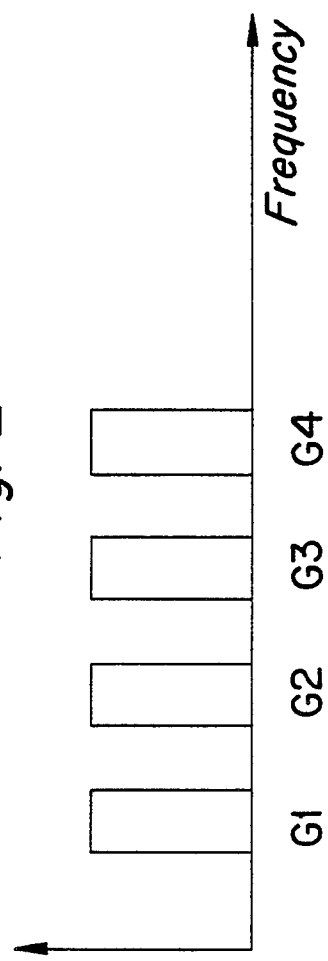

ALTERNATING GRATING TUNABLE DBR LASER

BACKGROUND

The present invention generally relates to wavelength-division multiplexing and optical communications and, more particularly, to a laser which can be used in such systems.

Wave-division multiplexing is a desirable way to increase the capacity of existing and future optical fiber lines, because it uses the vast frequency domain available in an optical fiber by assigning different wavelengths to different channels. To make such a system even more flexible, it would be desirable to provide lasers which can be tuned to the wavelengths of the different channels, instead of having one laser with a fixed wavelength for each channel. Although continuous tuning over the entire range of wavelengths may not be necessary, it would nonetheless be desirable to have a continuous tuning range around each channel so that the wavelengths can be precisely adjusted to fit the channel.

Excluding external cavity lasers, which, for some types of applications are not very practical, there are two basic categories of tunable semiconductor lasers. The first category includes those lasers which use tunable Bragg gratings and the second category includes those lasers which use an interferometric principle. This first category includes, for example, two and three section Distributed Bragg Reflectors (DBR) lasers, multi-section Distributed Feedback (DFB) lasers and sampled-grating DBR lasers. The second category includes, for example, the $C^3$ laser and the Y-junction laser. Each of these types of lasers has different problems associated with its use in optical communication systems. For example, the multi-section DBR lasers and DFB lasers have limited tuning ranges. The $C^3$ laser suffers from poor reproducibility and has complex control considerations, while the Y-junction lasers also suffer from control problems.

Another solution is to provide several lasers, each of which lases at a different wavelength, and to then combine their output to produce an optical signal including wavelengths of the different channels. This solution, however, is problematic in that it is relatively expensive since drive electronics are needed for each laser, combining the outputs from lasers with low losses can be difficult and the size of such devices is relatively large.

The tuning range of a conventional DBR laser is limited by the tuning range of a single Bragg grating, i.e., up to a maximum of ten to fifteen nanometers. The so-called sampled grating DBR lasers avoid this limitation by modulating the gratings to generate two combs of sidebands. By aligning a given sideband from one grating with a sideband from the other grating, one can thus select the lasing wavelength. However, obtaining all the desired channel wavelengths may be difficult because the tuning is not continuous and proceeds by jumps. Making these jumps coincide with the channel spacing is a difficult design and fabrication problem. Also, the relation between the control currents and the output wavelength is in general not monotonic (the wavelength may jump back and forth when the currents are increased) which makes control complicated.

Thus, it would be desirable to provide, for example, a DBR laser with an extended tuning range to overcome the shortcomings of conventional lasers in, for example, optical communication applications.

SUMMARY

These and other drawbacks and difficulties of conventional lasers which are used in optical communication systems are overcome according to the present invention. According to exemplary embodiments of the present invention, a modified DBR laser has several tunable gratings on each side of the gain section. These tunable gratings are arranged so that there are several continuous tuning ranges for the lasing wavelength, each of which corresponds to a different pair of gratings.

BRIEF DESCRIPTION OF THE DRAWINGS

The foregoing, and other, objects, features and advantages of the present invention will be more readily understood upon reading the following detailed description in conjunction with the drawings in which:

FIG. 1 illustrates an exemplary alternating grating DBR laser according to the present invention;

FIG. 2 illustrates exemplary grating reflection bands for the laser of FIG. 1;

DETAILED DESCRIPTION

Figure 3:
FIG. 3 is an example of a continuous tuning range of an exemplary laser.

According to exemplary embodiments of the present invention, a DBR laser is fabricated with several modifications that extend the tunability of the laser wavelength. An exemplary embodiment of a laser according to the present invention is illustrated in FIG. 1. In FIG. 1, note that a gain section which includes the light emitting layer of the substrate, is disposed as a center section of the laser. Next to the gain section is a phase control section. This section allows fine tuning of the lasing wavelength by adjusting the round-trip phase of the light in the laser. This is accomplished by changing the effective refractive index of the phase section through current injection. The phase control section can be omitted from the laser when fine tuning of the wavelength is not necessary.

On either side of the gain section, a plurality of grating sections, G1, G2, G3, and G4 are disposed. Although four grating sections are shown in the exemplary embodiment of FIG. 1, those skilled in the art will readily appreciate that a greater or lesser number of gratings can be provided depending on the tuning range or ranges of the laser that are desired. This feature of the present invention will become more apparent after reading the following discussion. Also in FIG. 1, note that the gain and phase sections have electrical contacts 10 and 20, respectively, while each grating section has its own electrical contact for current injection denoted by reference number 30. A common ground contact 40 for all sections is also provided. Additionally, each end of the laser device 50 is coated with an anti-reflection coating to avoid lasing on the Fabry-Perot modes due to the end facets.

The periods (i.e., the center wavelengths) and the strengths (i.e., the coupling coefficients) for each of the grating sections G1 through G4 can be selected so that when no current is applied to the gratings, there is no spectral overlap between their reflection bands. In this way, there is no feedback and thus no laser oscillation. The positioning of the grating sections relative to the gain section 10 can be as follows. The grating section with the longest center wavelength (smallest center frequency) is denoted grating G1, the grating with the next longest center wavelength G2, the grating with the third longest wavelength is G3 and the grating with the shortest wavelength is G4. Then, the odd-numbered gratings are arranged on one side of the gain section 10 and the even-numbered gratings are arranged on the other side. This results in the arrangement of sections illustrated in FIG. 1. Although the exemplary embodiment of FIG. 1 shows gratings G1 and G4 being further from the gain section than gratings G3 and G2, respectively, those skilled in the art will appreciate that the order of placement of the gratings on each side is not critical, the point being to place the proper gratings on each side.

The spectral ordering of the grating sections G1–G4 is illustrated in FIG. 2. Note that although the reflection spectrums of the gratings are illustrated in FIG. 2 as being rectangular, those skilled in the art will appreciate that the actual shape of the reflection spectrum is more complex. However, rectangles are used in FIG. 2 simply to illustrate that the gratings are arranged in order of decreasing wavelength (increasing frequency). Thus, according to exemplary embodiments of the present invention, gratings having decreasing periods are alternately placed on either side of the gain section 10.

By injecting carriers via the electrodes 30 into the grating sections the effective index of refraction, and thus the center wavelength of the refraction gratings, can be reduced. When the refractive index ($n_{eff}$) of a grating is reduced there is a shift of the reflection band towards shorter wavelengths, i.e., since the center wavelength $\lambda_0 = 2n_{eff}\Lambda$, where $\Lambda$ is the physical period of the grating. In this way, each grating can be tuned to make its own reflection band coincide with the reflection band of a grating on the other side of the gain section to provide lasing. Tuning of the lasing wavelength can then be obtained by tuning both gratings involved and/or by using the phase tuning section 20. Tuning both gratings, but in such a way that the center wavelengths of their reflection bands are the same, allows tuning of the lasing wavelength since lasing will occur only at wavelengths where there is feedback (provided by the gratings). Within the range of frequencies where the gratings provide feedback, the phase section can be used to fine-tune the lasing wavelength. This is done by changing the effective refractive index of the phase section by carrier injection. This index change will change the round-trip phase of the light in the laser and thus the lasing wavelength.

Figure 4:
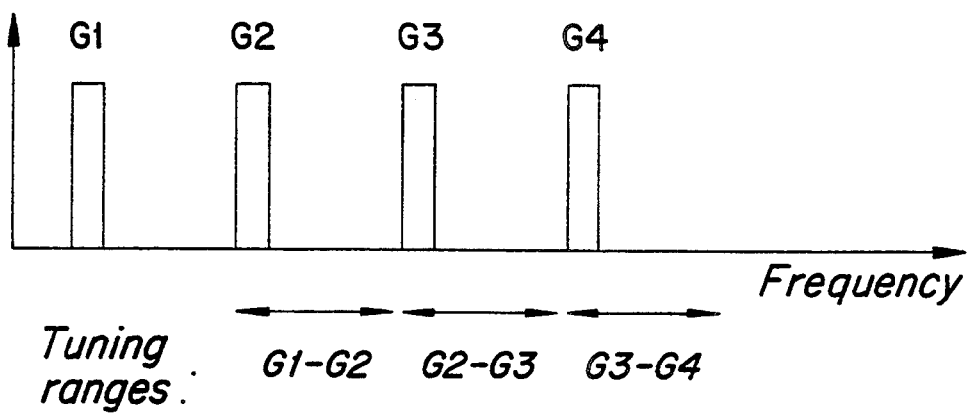
FIG. 4 shows exemplary tuning ranges for the laser of FIG. 1.

An example of a tuning operation according to the present invention is illustrated in FIG. 3. By applying currents to gratings G1 and G2 via their respective electrode 30, the center wavelengths of G1 and G2 can be moved to a desired position. The lasing wavelength can then be adjusted using the phase section 20. Depending on the amount of tuning possible with each grating, the lasing wavelength can be tuned continuously over the complete range between two grating center wavelengths. Thus, for the exemplary laser of FIG. 1, three such continuous tuning ranges are created as shown in FIG. 4.

Figure 5:
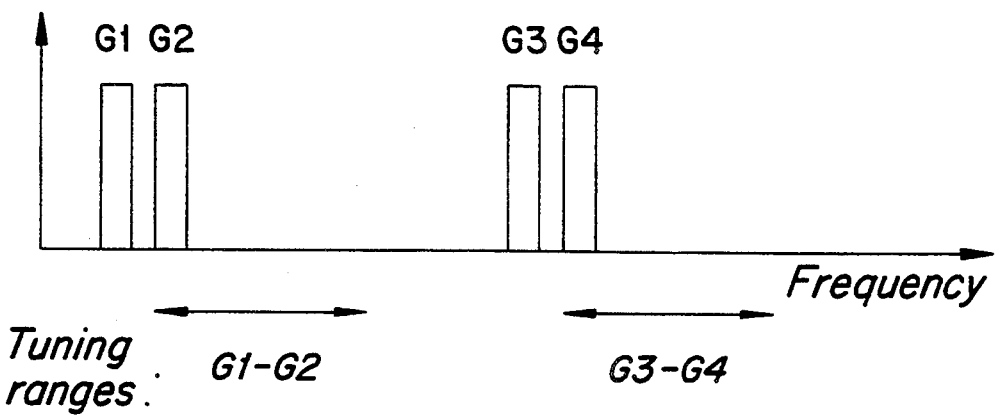
FIG. 5 illustrates another exemplary set of tuning ranges for the laser of FIG. 1.

Although the foregoing examples have been illustrated in terms of gratings having center wavelengths which are equally spaced apart, those skilled in the art will readily appreciate that gratings having unequal spacing of centered wavelengths can also be used to fabricate lasers in accordance with the present invention. For example, if it is desired to cover two wavelength ranges that are relatively far apart, the arrangement illustrated in FIG. 5 can be used. Note that in FIG. 5 that the center wavelengths of the two grating sections having the shortest wavelengths, G1 and G2, are closely grouped together as are the two grating sections having the longest wavelengths, G3 and G4. In this way two tuning ranges can be created, i.e., a range using G1 and G2 and a range using G3 and G4.

The structure of the gratings, gain and phase sections can be implemented using conventional technology and, accordingly, are not further described herein. For background material, however, reference is made to "Semiconductor Lasers for Coherent Optical Fiber Communications", T. L. Koch and U. Koren, (J. Lightwave Technology, vol. 8 (3) March 1990, pages 274 through 293), which is incorporated here by reference. Lasers according to the present invention can be fabricated using any semiconductor material which permits the fabrication of heterostructure semiconductor lasers, for example, AlGaAs/GaAs and InGaAsP/InP. The phase and grating sections have a core (bulk or quantum wells) such that the absorption edge of the core material has a shorter wavelength than the light of the laser and a cladding with a larger bandgap. The gain section has a material which can amplify the light going through when current is injected therein.

For the purposes of illustration, a specific example will now be discussed. Assume that InCaAsP on a InP substrate is being used and that the laser is to operate around 1.55 $\mu$m (i.e., the wavelength of minimum loss in optical fibers). Typical waveguide core dimensions for all sections are 0.6 to 2 microns wide and 0.1 to 0.5 microns thick. Using bulk material in the phase and grating sections, the core material will typically have a bandgap in the range of 1.3 to 1.42 microns. The latter is preferable because a smaller bandgap energy (larger bandgap wavelength) gives larger tuning ranges for the gratings. The tuning range of each grating for this example will be about 7 to 12 nm.

The coupling coefficients $k_i$ of the gratings, which measure grating strength, should be large (i.e., about 100 cm$^{-1}$ or more) to allow the use of short grating sections. This is desirable for several reasons, for example, to avoid stitching problems during e-beam lithography, decrease absorption losses, and decrease total cavity length to get better longitudinal mode discrimination. On the other hand, the coupling coefficient should not be too large because the width of the reflection band of a grating is proportional thereto. If $L_i$ is the length of a grating, the maximum power reflectivity (at the center wavelength) is approximately given by $\tanh^2(K_iL_i)$. Taking a $K_iL_i$ product of about 1 gives a reasonable peak reflectivity of about 0.58. For $K = 100$ cm$^{-1}$, this corresponds to a grating length of about 100 microns. The phase section can be short (about 100 microns) and the gain section can be between 300 and 500 microns long. The electrical isolation regions between the sections should be on the order of 50 microns long. Thus, for the device of FIG. 1, the minimum length is on the order of 1.3 mm; a relatively short length which beneficially increases fabrication yields.

As another example, assume that a laser according to the present invention is to be used in a WDM (Wavelength Division Multiplexing) system with 4 channel wavelengths. Channels 1 to 4 are at wavelengths of 1560, 1556, 1552 and 1548 nm, respectively (i.e., with a 4 nm spacing). Also assume that the design objective is to reach all these channels with a device which has a tuning range greater than 8 nm, $K=100$ cm$^{-1}$ and an effective index $n_{eff}=3.25$ in the grating sections (this is a typical value; the exact value can be computed for each device). These design objectives imply that the reflection bands will have a Full-Width Half-Maximum (FWHM) of about 2.4 nm. Thus, to avoid unwanted oscillation, the center wavelengths of the gratings should be further apart than 2.4 nm, e.g., at least 3 nm.

An exemplary laser configuration according to the present invention that achieves these objectives is a laser as illustrated in FIG. 1, with four gratings having the following grating center wavelengths: 1564 nm (G1), 1560 nm (G2), 1552 nm (G3) and 1548 nm (G4). Given that the gratings can be tuned at least 8 nm, all of the channel wavelengths can be reached as follows: (1) by tuning G1 to coincide with G2, (2) by tuning both G1 and G2 to 1556 nm, (3) by tuning G2 to coincide with G3, and (4) by tuning G3 to coincide with G4.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims.

What is claimed is:

1. A semiconductor laser comprising:
   a cavity;
   a gain section disposed substantially centrally in said cavity, thereby dividing said cavity into a first and second area;
   a phase control section disposed adjacent said gain control section;
   first, second, third and fourth grating sections, two each disposed in said first and second areas, and each having a reflection spectrum having a central wavelength, wherein said first grating section has a lowest central wavelength, said second grating section has a second lowest central wavelength, said third grating section has a third lowest central wavelength and said fourth grating section has a highest central wavelength; wherein said first and third grating sections are disposed in said first area and said second and fourth grating sections are disposed in said second area, and
   means for changing an effective refractive index in each of said grating sections independently.

2. A semiconductor laser comprising:
   a cavity;
   a gain section in said cavity;
   at least three grating sections, at least two of which have different center wavelengths, arranged on opposing sides of said gain section, wherein said grating sections are arranged based on an order of their respective center wavelength; and
   means for changing an effective refractive index in each of said at least three grating sections independently of one another.

3. The laser of claim 2, wherein said at least three grating sections are arranged on opposing sides of said gain section in an alternating manner and said order is from lowest to highest center wavelength.

4. The laser of claim 2, further comprising:
   a phase control section.

5. The laser of claim 2 wherein said center wavelengths are evenly spaced apart.

6. The laser of claim 2, wherein at least some of said center wavelengths are unequally spaced apart.

7. A method of tuning a semiconductor laser having a gain section in a cavity to provide a continuous tuning range around a communication channel comprising the steps of:
   providing at least three grating sections in said cavity,
   arranging some of said at least three grating sections on opposing sides of said gain section, and
   injecting current into at least one of said at least three grating sections to adjust a refractive index thereof, such that a center wavelength of said at least one grating section becomes equal to a center wavelength of another of said at least three grating sections on an opposite side of said gain section from said at least one grating section.

8. The method of claim 7, wherein said step of arranging further comprises the step of:
   ordering said at least three grating sections from highest to lowest center wavelength, and
   placing said grating sections on opposing sides of said gain sections in an alternating manner based on said ordering step.

* * * * *